(12) United States Patent
Lee et al.

(10) Patent No.: US 8,912,035 B2
(45) Date of Patent: Dec. 16, 2014

(54) SOLAR CELL AND FABRICATING METHOD THEREOF

(71) Applicant: LG Electronics Inc., Seoul (KR)

(72) Inventors: Seongeun Lee, Seoul (KR); Jiweon Jeong, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/071,467

(22) Filed: Nov. 4, 2013

(65) Prior Publication Data

US 2014/0057384 A1 Feb. 27, 2014

Related U.S. Application Data

(62) Division of application No. 12/869,550, filed on Aug. 26, 2010, now abandoned.

(30) Foreign Application Priority Data

Aug. 27, 2009 (KR) ........................ 10-2009-0079934

(51) Int. Cl.
*H01L 31/0224* (2006.01)
*H01L 31/068* (2012.01)
*H01L 31/18* (2006.01)
*H01L 31/0216* (2014.01)

(52) U.S. Cl.
CPC ....... *H01L 31/022441* (2013.01); *Y02E 10/542* (2013.01); *H01L 31/068* (2013.01); *H01L 31/022425* (2013.01); *H01L 31/1804* (2013.01); *H01L 31/02167* (2013.01); *Y02E 10/547* (2013.01); *Y02E 10/52* (2013.01)
USPC .............................................. 438/71; 438/72

(58) Field of Classification Search
None
See application file for complete search history.

(56) References Cited

U.S. PATENT DOCUMENTS

| 4,322,571 A | 3/1982 | Stanbery |
| 4,640,001 A | 2/1987 | Koiwai et al. |

(Continued)

FOREIGN PATENT DOCUMENTS

| EP | 2077585 A1 | 7/2009 |
| JP | 2006-332032 A | 12/2006 |

(Continued)

OTHER PUBLICATIONS

Balif et al., Nature of the Ag-Si Interfacein Screen-Printed Contacts: A Detailed Transmission Electron Microscopy Study of Cross-sectional Structures, 2002, p. 360-363.

*Primary Examiner* — Seahvosh Nikmanesh
(74) *Attorney, Agent, or Firm* — Birch, Stewart, Kolasch & Birch, LLP

(57) ABSTRACT

Discussed herein are a solar cell and a fabricating method thereof. The solar cell includes a first conductivity-type semiconductor substrate, a second conductivity-type semiconductor layer formed on a front surface of the first conductivity-type semiconductor substrate, and having a conductivity opposite to that of the first conductivity-type semiconductor substrate, an anti-reflection film including at least one opening exposing a part of a surface of the second conductivity-type semiconductor layer, and formed on the second conductivity-type semiconductor layer, at least one front electrode contacting a part of the surface of the second conductivity-type semiconductor layer exposed through the at least one opening, and at least one rear electrode formed on a rear surface of the first conductivity-type semiconductor substrate, wherein the at least one front electrode includes a metal containing silver and lead-free glass frit.

8 Claims, 6 Drawing Sheets

(56) References Cited

U.S. PATENT DOCUMENTS

| | | |
|---|---|---|
| 5,759,292 A | 6/1998 | Arimoto et al. |
| 7,494,607 B2 | 2/2009 | Wang et al. |
| 8,106,291 B2 * | 1/2012 | Karakida et al. ............. 136/256 |
| 2004/0112426 A1 | 6/2004 | Hagino |
| 2007/0186970 A1 | 8/2007 | Takahashi et al. |
| 2007/0209697 A1 | 9/2007 | Karakida et al. |
| 2008/0230119 A1 * | 9/2008 | Akimoto ...................... 136/255 |
| 2009/0189126 A1 | 7/2009 | Prunchak |
| 2010/0190286 A1 | 7/2010 | Kohira et al. |
| 2010/0275987 A1 | 11/2010 | Sakamoto et al. |

FOREIGN PATENT DOCUMENTS

| | | |
|---|---|---|
| JP | 2008-109016 A | 5/2008 |
| KR | 10-2006-0108552 A | 10/2006 |
| KR | 10-2009-0090843 A | 8/2009 |
| WO | 2008/078771 A1 | 7/2008 |
| WO | 2009/037955 A1 | 3/2009 |
| WO | 2009/052460 A1 | 4/2009 |

* cited by examiner

SOLAR CELL AND FABRICATING METHOD THEREOF

This application is a Divisional of copending application Ser. No. 12/869,550 filed on Aug. 26, 2010, which claims priority to and the benefit of Korean Patent Application No. 10-2009-0079934, filed on Aug. 27, 2009 in the Korean Intellectual Property Office. The entire contents of all of the above applications is hereby incorporated by reference.

BACKGROUND OF THE INVENTION

1. Field of the Invention

Embodiments of the present invention relate to a solar cell and a fabricating method thereof, and more particularly to a fabricating method of a solar cell for producing the solar cell having a reliable quality and a high efficiency with a high yield, and reduce process costs while preventing or reducing environmental pollution.

2. Discussion of the Related Art

Recently, as exhaustion of existing energy resources, such as oil and coal, is expected, there is increasing interest in alternative energy sources. Among them, solar cells are a source of abundant energy and do not cause environmental pollution, and thus, are attracting wide attention. Types of solar cells include a solar heat cell which generates steam required to rotate a turbine using solar heat, and a solar photovoltaic cell which converts sunlight into electric energy using properties of a semiconductor. In general, a solar cell refers to a solar photovoltaic cell.

The solar cell is an apparatus to convert light energy into electric energy using a photovoltaic effect. The solar cell has advantages, such as no pollution, unlimitedness of resources, and a semi-permanent life span, and is expected to become an energy source capable of eventually solving energy problems of humankind in addition to environmental problems.

Fossil fuels are expected to run out several years from now, and simultaneously, environmental problems, such as global warming, due to discharge of carbon dioxide according to use of a large amount of fossil fuels are on the rise. Therefore, solar cells producing electricity using sunlight, which is an unlimited energy source, are a focus of interest and attention.

Solar cell development focuses on reducing the unit cost per watt (W) of power production. For this purpose, current research is focused on unit cost reduction of the solar cells or increase of the efficiency of the solar cells.

Types of solar cells are divided into silicon solar cells, thin film solar cells, dye-sensitized solar cells, and organic polymer solar cells according to their components. Since crystalline silicon solar cells make up the majority of global solar cell production, have high efficiency compared with other solar cells, and a technique to reduce the unit cost of the crystalline silicon solar cells has been developed continuously, the crystalline silicon solar cells may be referred to as the most popular solar cells.

Accordingly, a solar cell, a fabricating process of which is improved to reduce process costs so as to reduce the unit cost of the solar cell, and to increase a production yield of the solar cell, has been required.

SUMMARY OF THE INVENTION

An object of the present invention is to provide a fabricating method of a solar cell, and particularly a structure and process of the solar cell in which formation of electrodes is improved, thereby being environmentally friendly, stabilizing the process, reducing process costs, and achieving mass production of the high-efficiency solar cell.

Another object of the present invention is to provide a solar cell including improved electrodes in terms of a material, which maintains reliability in quality of the solar cell without lowering the efficiency of the solar cell, and does not cause environmental pollution.

The objects of the present invention are not limited to the above-mentioned object and other objects that have not mentioned above will become evident to those skilled in the art from the following description.

To achieve the above objects, there is provided a solar cell according to an example embodiment of the present invention, including a first conductivity-type semiconductor substrate, a second conductivity-type semiconductor layer formed on the front surface of the first conductivity-type semiconductor substrate, and having a conductivity opposite to that of the first conductivity-type semiconductor substrate, an anti-reflection film including at least one opening exposing a part of surface of the second conductivity-type semiconductor layer, and formed on the second conductivity-type semiconductor layer, at least one front electrode contacting part of the surface of the second conductivity-type semiconductor layer exposed through the at least one opening, and at least one rear electrode formed on a rear surface of the first conductivity-type semiconductor substrate.

The first conductivity-type may be a p-type and the second conductivity-type may be an n-type, or vice versa, as needed. Therefore, the first conductivity-type semiconductor substrate may be a p-type semiconductor substrate doped with a p-type impurity. Further, the second conductivity-type semiconductor layer may be an $n^+$-type emitter doped with an n-type impurity.

The front and rear surfaces of the first conductivity-type semiconductor substrate may have an uneven structure including prominences and depressions by texturing. If the front surface of the first conductivity-type semiconductor substrate has the uneven structure including prominences and depressions by texturing, the front surfaces of the second conductivity-type semiconductor layer and the anti-reflection film stacked on the first conductivity-type semiconductor substrate may have an uneven structure including prominences and depressions.

If the front surface of the second conductivity-type semiconductor layer has the uneven structure including prominences and depressions, the prominences and depressions in an exposed region of the front surface of the second conductivity-type semiconductor layer contacting the at least one front electrode through the opening may be removed or have a smaller size than the prominences and depressions in other regions of the front surface.

The at least one front electrode may include a metal containing silver (Ag) and glass frit. The glass frit may be lead-free.

The at least one front electrode may include two metal components, i.e., a first metal component made of silver (Ag) or an alloy containing silver (Ag), and a second metal component made of a metal element selected from the group consisting of various conductive metals.

The metal components are not limited to a specific composition, but the first metal component may be provided in about 50~90 wt % with respect to a total wt % of metal components and the second metal component may be provided in about 0.2~5 wt % with respect to the total wt % of metal components. Preferably, but not necessarily, the front electrodes may include, with respect to the total wt % of metal components of the front electrodes, about 50~85 wt % of silver (Ag) or an alloy containing silver (Ag), and about 0.2~5 wt % of at least one metal selected from the group consisting of zinc (Zn), silicon (Si), aluminum (Al), copper (Cu), manganese (Mn), bismuth (Bi), phosphorus (P), boron (B), barium (Ba), and palladium (Pd).

The second conductivity-type semiconductor layer may be the $n^+$-type emitter doped with a high concentration of the n-type impurity. A doping concentration of the $n^+$-type emitter is not limited to a specific level, but may be $1 \times 10^{19} \sim 1 \times 10^{21}$ atom/cm$^3$. By doping the $n^+$-type emitter with a high concentration of the n-type impurity, the sheet resistance of the $n^+$-type emitter may be lowered, thereby improving contact efficiency with metal electrodes. The sheet resistance of the $n^+$-type emitter is not limited to a specific level, but may be about 30~100Ω/square.

The thickness of the second conductivity-type semiconductor layer is not limited to a specific level, but may vary from about 600~1,000 nm to about 100~500 nm.

Particularly, the formation of the at least one front electrode of the solar cell in accordance with the present invention is not achieved by a general fire-through process, and thus may prevent or reduce generation of short circuit of front electrodes through an ultra-thin second conductivity-type semiconductor layer during formation of the front electrodes of a conventional solar cell. Therefore, although the second conductivity-type semiconductor layer of the solar cell of the present invention is formed in an ultra-thin type, the at least one front electrode may be easily formed without any short circuit. In order to more firmly prevent the short circuit, the thickness of the second conductivity-type semiconductor layer in a region of which that contacts the at least one front electrode may be smaller than the thickness of the second conductivity-type semiconductor layer in regions of which that do not contact the at least one front electrode.

The anti-reflection film in the present invention is not limited to a specific material, but may include at least one selected from the group consisting of a silicon oxide film, a silicon oxynitride film, and a silicon nitride film. The anti-reflection film may include at least one layer.

The at least one rear electrode is not limited to a specific material, but may be made of conductive metal. Preferably, but not necessarily, the at least one rear electrode includes metal containing aluminum (Al), silver (Ag), or an aluminum silver (AgAl) alloy, and glass frit. In the same manner as the at least one front electrode, glass frit for the at least one rear electrode may be lead-free.

A back surface field (BSF) layer may be formed on an interface between the rear surface of the first conductivity-type semiconductor substrate and the at least one rear electrode.

The back surface field layer may be a high-concentration first conductivity-type semiconductor impurity region formed by diffusing a first conductivity-type material contained in the at least one rear electrode onto the rear surface of the first conductivity-type semiconductor substrate through heat treatment. If an aluminum paste is used as a rear electrode paste, the back surface field layer may be an aluminum-back surface field (Al-BSF) layer.

The solar cell may further include a dielectric layer provided between the second conductivity-type semiconductor layer and the anti-reflection film, and having at least one opening located at the same position as the at least one opening of the anti-reflection film In this instance, the at least one front electrode may contact the part of the surface of the second conductivity-type semiconductor layer through the at least one opening of the anti-reflection film and the at least one opening of the dielectric layer.

Further, as needed, the solar cell may further include a dielectric layer provided on the rear surface of the first conductivity-type semiconductor substrate. In this case, the at least one rear electrode may contact a part of the rear surface of the first conductivity-type semiconductor substrate through a part of the dielectric layer. The back surface field layer formed from the at least one rear electrode may be formed in a region in which the part of the rear surface of the substrate and the at least one rear electrode.

To achieve the above objects, there is provided a fabricating method of a solar cell according to an example embodiment of the present invention, including forming a second conductivity-type semiconductor layer by doping a first conductivity-type semiconductor substrate with a second conductivity-type impurity having a conductivity opposite to that of the first conductivity-type semiconductor substrate, forming an anti-reflection film on the second conductivity-type semiconductor layer, forming at least one opening exposing a part of a surface of the second conductivity-type semiconductor layer by etching the anti-reflection film, forming at least one front electrode contacting the part of the surface of the second conductivity-type semiconductor layer exposed through the at least one opening, and forming at least one rear electrode formed on a rear surface of the first conductivity-type semiconductor substrate.

The at least one electrode may be formed by applying an etching paste in a pattern on the anti-reflection film using a screen printing method or a direct printing method and etching patterned regions.

Further, the at least one opening may be formed by patterning a mask layer on the anti-reflection film, etching the anti-reflection film in regions in which the mask layer is not formed, and then removing the mask layer.

Here, the mask layer may be an etching prevention mask layer, or may be a mask layer made of a material resistant to a method of etching the at least one opening. Particularly, the mask layer may be formed by patterning an etching prevention paste on the anti-reflection film using the screen printing method or the direct printing method. If a wet chemical etching method using an alkali solution is employed as the method of etching the at least one opening through the anti-reflection film, the mask layer may be formed in other regions except for a region in which the at least one opening is formed on the anti-reflection film, using a masking paste including an alkali-resistant material, such as silicon nitride, in the screen printing method. The at least one opening may be formed through the anti-reflection film by etching regions except for the regions covered with the mask layer with an etching solution, and then the mask layer may be removed.

When the at least one opening is formed through the anti-reflection film, the formation of the at least one front electrode may be achieved by applying an electrode paste in the at least one opening using the screen printing method or the direct printing method and performing heat treatment. In this instance, the same screen mask pattern may be used to pattern the etching paste and the electrode paste.

Further, the electrode paste used in the fabricating method of the solar cell of the present invention may be an electrode paste including a metal containing silver (Ag) or a metal alloy containing silver (Ag), lead-free glass frit, and a resin binding agent are dispersed in an organic medium.

A temperature of the heat treatment carried out after the application of the electrode paste is not limited to a specific level. However, since the heat treatment is used to deposit the electrode paste so as to contact the second conductivity-type semiconductor layer exposed through the at least one opening of the anti-reflection film, the temperature of the heat treatment may be lower than a temperature of heat treatment carried out during a general electrode formation process including contact of electrodes with a second conductivity-type semiconductor layer through an anti-reflection film by a firing process. Preferably, but not necessarily, the temperature of the heat treatment is about 500~850° C.

The fabricating method of the solar cell may further include forming prominences and depressions on the front surface or the front and rear surfaces of the first conductivity-type semiconductor substrate by texturing the first conductivity-type semiconductor substrate.

The front surface or the front and rear surfaces of the first conductivity-type semiconductor substrate may have the prominences and depressions by texturing the first conductivity-type semiconductor substrate before a fabricating process of the solar cell is performed.

The texturing may be carried out by any one method out of a wet chemical etching method, a dry chemical etching method, an electrochemical etching method, and a mechanical etching method, but is not limited thereto.

When the first conductivity-type semiconductor substrate having the uneven structure including prominences and depressions on the surfaces thereof by texturing undergoes the fabricating method of the present invention, an etching process to form the at least one opening is carried out, and thus a size of the prominences and depressions in a region in which the at least one front electrode is formed and a size of the prominences and depressions in remaining regions in which the at least one front electrode is not formed are different. That is, the prominences and depressions in the region in which the at least one front electrode is formed may be removed or have a smaller size than the prominences and depressions in the remaining regions in which the at least one front electrode is not formed.

The formation of the at least one rear electrode may include forming a back surface field layer on the rear surface of the first conductivity-type semiconductor substrate by applying a rear electrode paste to the rear surface of the first conductivity-type semiconductor substrate and performing heat treatment.

After the front electrode paste is formed in the at least one opening and the rear electrode paste is applied, the front electrode paste and the rear electrode paste may be simultaneously fired. If the front electrode paste and the rear electrode paste are simultaneously fired so as to form front and rear electrodes, sintering of the at least one front electrode, formation of the back surface field layer, and diffusion of hydrogen from the anti-reflection film to the inside of the semiconductor substrate may be simultaneously achieved. A temperature of heat treatment for such simultaneous firing may be somewhat higher than a temperature of heat treatment for firing of only the front electrode paste. Preferably, but not necessarily, the simultaneous firing may be carried out at a higher temperature, within the range of about 500~850° C., than that of the firing of only the front electrode paste.

Further, the fabricating method of the solar cell, prior to the formation of the at least one rear electrode, may further include forming a dielectric layer on the rear surface of the first conductivity-type semiconductor substrate, and forming at least one opening, through which the at least one rear electrode contacts the rear surface of the substrate, through the dielectric layer. The at least one opening to contact the at least one rear electrode may be formed using a photolithography method, an optical scribing method, a mechanical scribing method, a plasma etching method, a wet etching method, a dry etching method, a lift-off method, or a wire mask method. In addition, in the same manner as the at least one opening in which the at least one front electrode is formed, the at least one opening in which the at least one rear surface is formed may be formed using the screen printing method or the direct printing method.

If the first conductivity-type semiconductor substrate has an uneven structure having prominences and depressions on the surfaces thereof by texturing, the prominences and depressions in a region in which the at least one front electrode is formed and a region with which the at least one rear electrode be in contact may be removed or may have a smaller size than the prominences and depressions in other regions.

The dielectric layer may be formed on both of the front surface and the rear surface of the first conductivity-type semiconductor substrate, or may be formed on either of the front surface and the rear surface of the first conductivity-type semiconductor substrate.

The dielectric layer may include at least one out of a silicon oxide (SiOx), a silicon oxynitride (SiONx), and a silicon nitride (SiNx).

In the fabricating method of the solar cell, the dielectric layer may be formed by atmospheric pressure chemical vapor deposition (APCVD), low pressure chemical vapor deposition (LPCVD), plasma enhanced chemical vapor deposition (PECVD), sputter deposition, electron beam vapor deposition, and a spin-on process.

Detailed matters of other example embodiments will be incorporated by the following description and drawings.

DETAILED DESCRIPTION OF THE EMBODIMENTS

The advantages and features of the present invention, and the way of attaining them, will become apparent with reference to embodiments described below in conjunction with the accompanying drawings.

FIGS. 1 to 9 are sectional views sequentially illustrating a fabricating method of a solar cell in accordance with embodiments of the present invention.

Figure 7:
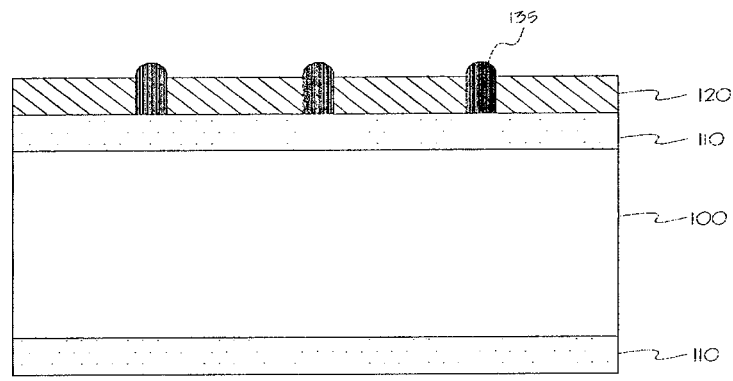
Figure 8:
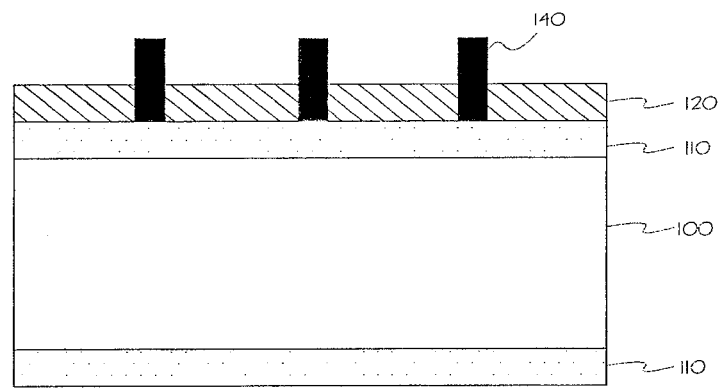
Figure 9:
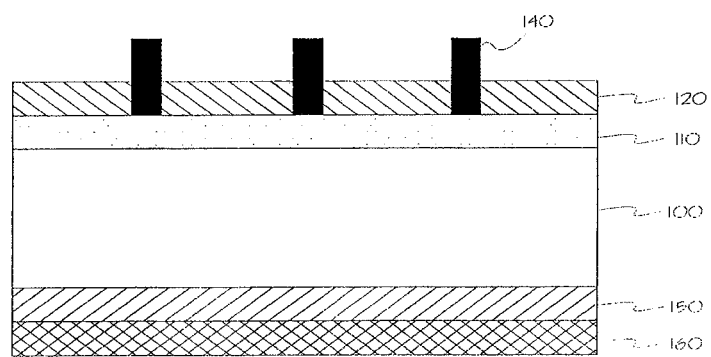

FIGS. 1 to 8 are sectional views schematically illustrating a fabricating process of a completed solar cell shown in FIG. 9. Embodiments of the solar cell are not limited thereto, but may be fabricated through various processes which do not deviate from the technical scope of embodiments of the present invention.

Figure 1:
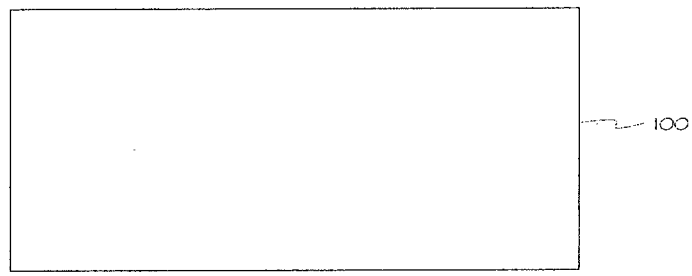
FIGS. 1 to 9 are sectional views sequentially illustrating a fabricating method of a solar cell in accordance with embodiments of the present invention.

First, as shown in FIG. 1, a substrate 100 (also referred to as a p-type semiconductor substrate 100) is prepared by doping a semiconductor substrate with a p-type semiconductor impurity. Examples of the semiconductor for the p-type semiconductor substrate 100 may be silicon.

In FIG. 1, texturing of the p-type semiconductor substrate 100 may be added so as to form an uneven structure with prominences and depressions on the surface of the p-type semiconductor substrate 100.

Figure 2:
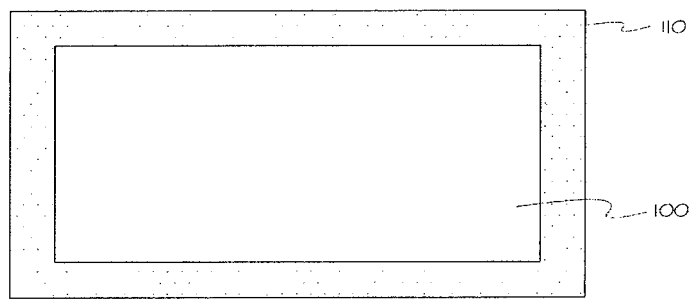

Thereafter, as shown in FIG. 2, an emitter layer 110 (also referred to as n-type doped layer or layers 110, or n-type emitter layer or layers 110) are formed at the surfaces of the p-type semiconductor substrate 100 by doping the p-type semiconductor substrate 100 with an n-type impurity.

Figure 3:
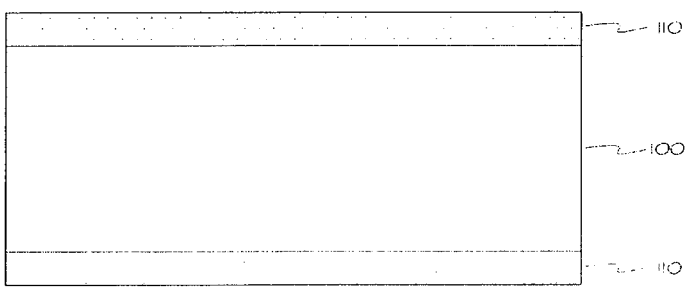

In accordance with this embodiment of the present invention, the surfaces of the p-type semiconductor substrate 100 are doped with the n-type impurity by injecting an n-type source gas into the p-type semiconductor substrate 100 when the p-type semiconductor substrate 100 moves along a conveyer belt. Therefore, both side surfaces as well as the front and rear surfaces of the p-type semiconductor substrate 100 are doped with the n-type impurity, as shown in FIG. 2. Thereafter, since the doped layers on the side surfaces of the p-type semiconductor substrate 100 are removed through an edge isolation process, FIG. 3 illustrates only the n-type doped layers 110 on the front and rear surfaces of the substrate 100.

The n-type doped layers 110 achieve a p-n junction on the interface with the p-type semiconductor substrate 100, and thus the n-type doped layer 110 formed on the front surface of the p-type semiconductor substrate 100 functions as the n-type emitter layer 110.

However, the n-type emitter layer 110 formed on the rear surface of the p-type semiconductor substrate 100 is compensated by a subsequent process of forming a rear electrode, and thus does not function as an emitter.

The formation of the n-type emitter layer 110 may be carried out using processes of doping an impurity, which are generally known, including a process of diffusing an impurity gas to a surface of a substrate within a furnace.

Thus, the n-type emitter layer 110 is doped with a high concentration of the n-type impurity. A doping concentration of the n-type emitter layer 110 is not limited to a specific level, but may be $1\times10^{19} \sim 1\times10^{21}$ atom/cm$^3$. By doping the n-type emitter layer 110 with a high concentration of the n-type impurity, the sheet resistance of the n-type emitter layer may be lowered, thereby improving contact efficiency with electrodes. The sheet resistance of the n-type emitter layer 110 is not limited to a specific level, but may be about 30~100Ω/square. The thickness of the n-type emitter layer 110 is not limited to a specific level, but may vary from about 600~1,000 nm to about 100~500 nm.

Figure 4:
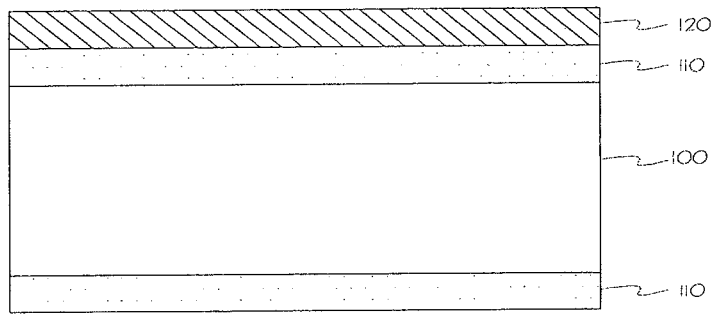

Thereafter, as shown in FIG. 4, an anti-reflection film 120 is formed on the n-type emitter layer 110 formed on the front surface of the substrate 100.

Although FIG. 4 illustrates the anti-reflection film 120 including a single layer, the anti-reflection film 120 is not limited thereto, but may include a plurality of layers. The anti-reflection film 120 is not limited to a specific material, but may be made of a material preventing or reducing received light from escaping and be preferably, but not necessarily, made of a silicon oxide film, silicon nitride film, or a combination thereof.

In detail, the material forming the anti-reflection film 120 may include, for example, a single layer of SiNx, two layers of SiNx/SiON or SiNx/SiOx, or three layers of SiOx/SiNx/SiOx, but is not limited thereto. The anti-reflection film 120 functions as a passivation layer as well as to minimize reflectivity of the solar cell.

Figure 5:
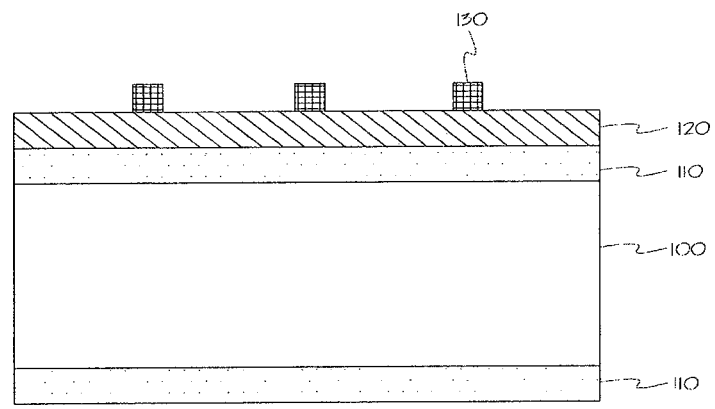

FIG. 5 illustrates one embodiment to form openings through the anti-reflection film 120. That is, a process of forming opening regions by patterning using an etching paste 130 is illustrated. The opening regions are regions in which front electrodes will be formed.

This embodiment of the present invention illustrates that the etching paste 130 is patterned through a mask and is printed in a pattern on the upper surface of the anti-reflection film 120 of the solar cell.

The formation of the patterned etching paste 130 on partial or local regions (or portions) of the anti-reflection film 120 is not limited to a specific method, but may be achieved by known printing or distributing methods. Preferably, but not necessarily, the etching paste 130 is formed in the pattern on the anti-reflection film 120 by a screen printing method or a direct printing method.

Thereafter, when the etching paste 130 undergoes heat treatment under controlled conditions of proper temperature and time, the anti-reflection film 120 under the etching paste 130 is removed, thereby forming the openings. After etching, the etching paste 130 remaining on the etched surface is removed using a proper solvent.

Figure 6:
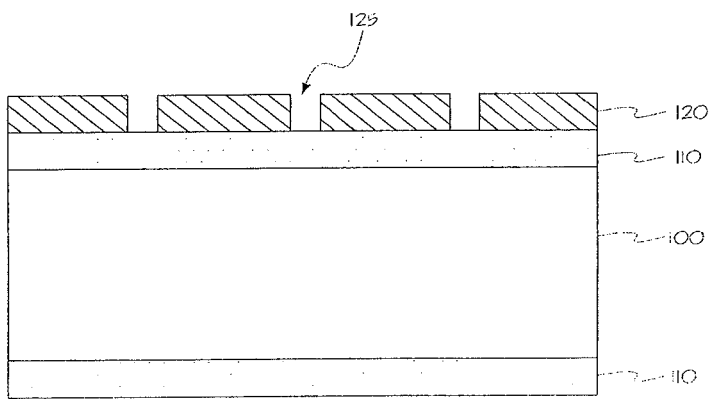

FIG. 6 is a sectional view of the solar cell after the formation of the openings by etching using the etching paste 130. As shown in FIG. 6, the anti-reflection film 120 in regions in which front electrodes will be formed is opened, thereby forming at least one opening 125.

If designated prominences and depressions are formed on the substrate 100 by texturing the front surface of the substrate 100, the surfaces of the prominences and depressions of the substrate 100 are exposed by etching using the etching paste 130 for forming the openings 125, and thus parts or all of the prominences and depressions are removed. Thereby, the prominences and depressions in the regions in which the openings 125 are formed may be removed or have a smaller size than the prominences and depressions in regions in which the openings 125 are not formed.

FIGS. 12 to 15 illustrate another embodiment to form openings through an anti-reflection film.

Differing from the embodiment of FIG. 5, in a process of forming the openings, as shown in FIGS. 12 to 15, a mask layer is formed on regions other than regions in which the openings will be formed.

Figure 12:
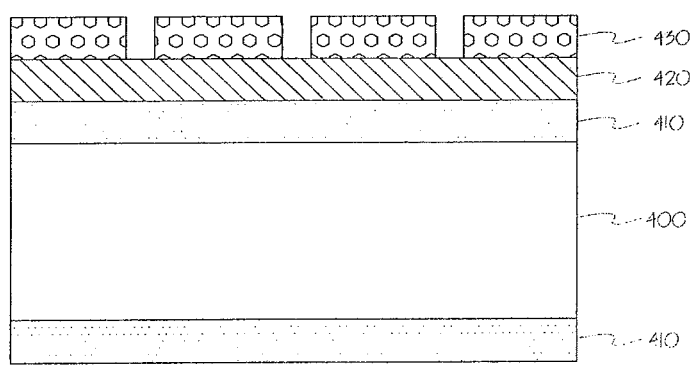
FIGS. 12 to 15 are sectional views sequentially illustrating formation of openings in accordance with another embodiment of the present invention.

With reference to FIG. 12, an n-type emitter layer 410 and an anti-reflection film 420 are sequentially formed on a semiconductor substrate 400, and a mask layer 430 is formed in regions other than opening regions so as to form a pattern of the openings.

The mask layer 430 is formed on the anti-reflection film 420 by the screen printing method or the direct printing method using a masking paste made of a material having resistance according to etching methods, i.e., a material functioning as an etching mask.

Preferably, but not necessarily, since the method of etching the openings is a dry chemical etching method or a wet chemical etching method, a masking paste including a material having resistance to an etching solution, i.e., an acid-resistant material or an alkali-resistant material, is patterned and formed on the anti-reflection film 420. Further, if the openings are etched using an alkali solution, it is preferable, but not required, that a masking paste including silicon nitride is used.

Figure 13:
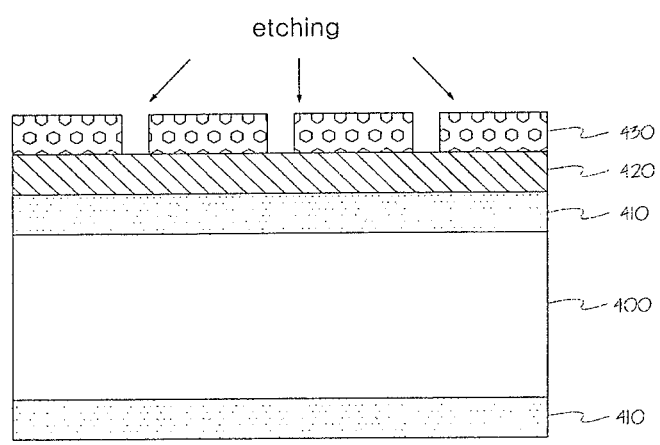
Figure 14:
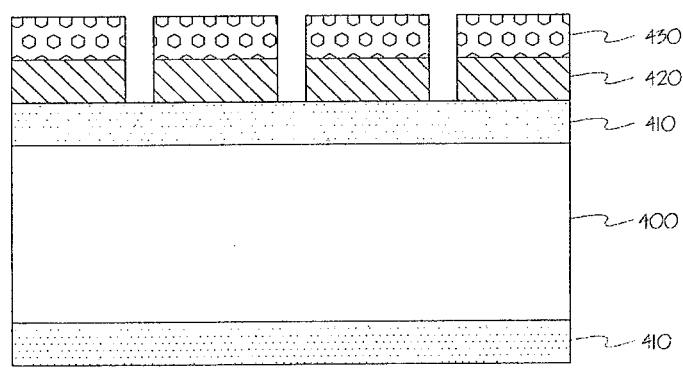

After the masking paste is patterned and applied to the anti-reflection film 420, regions other than the mask layer 430, obtained by applying the masking paste to the anti-reflection film 420, are etched by submerging the substrate 400 in the etching solution, as shown in FIG. 13, thereby forming the openings through the anti-reflection film 420 as shown FIG. 14.

Figure 15:
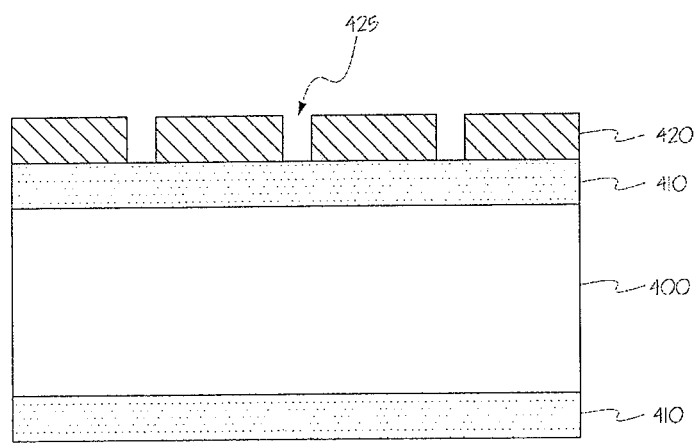

As shown in FIG. 15, when the mask layer 430 is removed after the anti-reflection film 420 is selectively etched using the mask layer 430, openings 425 are formed in a pattern through the anti-reflection film 420.

Referring back to FIGS. 7 to 9, FIGS. 7 to 9 illustrate a process of forming electrodes and a subsequent process of completing the solar cell.

Thereafter, as shown in FIG. 7, front electrodes are formed by patterning a front electrode paste 135 in the openings 125 of the anti-reflection film 120.

In the present invention, stable formation of the electrodes is expected using a two-stage screen printing method, by etching the anti-reflection film 120 in the regions in which the electrodes will be formed through a first screen printing using the etching paste 130 to etch the anti-reflection film 120 and then by forming the front electrode paste 135 in the openings through a second screen printing using the same screen mask pattern in accordance with this embodiment of the present invention, or by applying a masking paste through a first screen printing and forming the openings by etching and then by applying an electrode paste in the openings through a second screen printing in accordance with another embodiment of the present invention.

Here, the front electrode paste 135 is not limited to a specific composition, but may be lead (Pb)-free. Specifically, in a conventional fabricating process of a solar cell, front electrodes are formed in a screen printing method after deposition of an anti-reflection film, and then a silver (Ag) paste for the front electrodes penetrates the anti-reflection film through a subsequent firing process and thus contacts n-type emitter regions under the anti-reflection film. In this instance, in order to allow the silver (Ag) paste to penetrate the anti-reflection film, a lead (Pb) component in glass frit constituting a punch-through paste is essential. The lead (Pb) component causes environmental pollution and is harmful to the human body, and needs to be removed.

That is, since the lead (Pb) component causes environmental pollution and is harmful to the human body, use of the lead (Pb) component needs to limited or prohibited in consideration of environmental conservation. The front electrode paste in accordance with the present invention uses a composition not containing such a lead (Pb) component and is deposited through the above method to form the front electrodes, thereby being capable of protecting the environment.

In detail, the front electrode paste in accordance with one embodiment of the present invention includes metal containing silver (Ag) and glass frit, and the glass frit does not contain lead (Pb).

The front electrode paste may be formed in the openings through various conventional methods, such as the screen printing method or the direct printing method. Preferably, but not necessarily, in consideration of economic efficiency of the process, the front electrode paste is formed in the openings using the same screen mask pattern as that used in the first screen printing of the etching paste.

After the front electrode paste 135 is formed in the openings, the front electrode paste 135 is sintered into front electrodes 140 by heat treatment. FIG. 8 illustrates a process of causing the front electrodes 140 formed in the openings to contact the upper surface of the n-type emitter layer 110.

In this embodiment of the present invention, the front electrodes deposited through the heat treatment may include two metal components. That is, the front electrodes include a first metal component made of silver (Ag) or an alloy containing silver (Ag), and a second metal component made of a metal element selected from the group consisting of various conductive metals.

The above metal components are not limited to a specific composition, but the first metal component may be provided in 50~90 wt % with respect to the total wt % of metal components and the second metal component may be provided in about 0.2~5 wt % with respect to the total wt % of metal components. Preferably, but not necessarily, the front electrodes include, with respect to the total wt % of metal components of the front electrodes, about 50~85 wt % of silver (Ag) or an alloy containing silver (Ag), and about 0.2~5 wt % of at least one metal selected from the group consisting of zinc (Zn), silicon (Si), aluminum (Al), copper (Cu), manganese (Mn), bismuth (Bi), phosphorus (P), boron (B), barium (Ba), and palladium (Pd). Both the first metal component and the second metal component of the front electrodes in accordance with the present invention do not contain lead (Pb). For purposes of this disclosure, phosphorus will be referred to as a metal.

A temperature of the heat treatment carried out to sinter the front electrode paste 135 may be about 500~850° C., and is lower than a temperature of heat treatment carried out to perform a conventional fire-through process of a front electrode paste, and thus is advantageous in terms of process stability, yield, and process costs, compared with the conventional heat treatment.

The above process of forming the front electrodes in accordance with this embodiment of the present invention has excellent application to a solar cell having an ultra-thin n-type emitter or an ultra-thin silicon substrate as well as a general crystalline solar cell, and thus may be increasingly widely utilized.

Finally, the n-type doped layer 110 formed on the rear surface of the p-type semiconductor substrate 100 may be compensated by a process of forming a rear electrode.

FIG. 9 illustrates formation of the rear electrode. The n-type doped layer 110 formed on the rear surface of the p-type semiconductor substrate 100 is compensated by a process of applying a rear electrode paste and performing heat treatment of the rear electrode paste, thus forming a rear electrode 160 via the rear electrode paste on the rear surface of the p-type semiconductor substrate 100.

The rear electrode paste may be an aluminum paste or an aluminum silver paste. During the heat treatment, aluminum is diffused and further dopes the p-type semiconductor substrate 100, thereby forming a back surface field layer 150 doped with the p-type impurity at a higher concentration than a remainder of the p-type semiconductor substrate 100.

That is, the back surface field layer 150 doped with the p-type impurity at a higher concentration is formed on the interface between the rear electrode 160 and the rear surface of the p-type semiconductor substrate 100, thereby preventing or reducing lowering of efficiency due to recombination of electron-hole pairs separated by sunlight.

The rear electrode 160 may be formed by applying the rear electrode paste using known methods, such as a direct printing method, a screen printing method, a plating method, and a coating method. Preferably, but not necessarily, the rear electrode 160 is formed by applying the rear electrode paste using the screen printing method in the same manner as the formation of the front electrodes.

Figure 10:
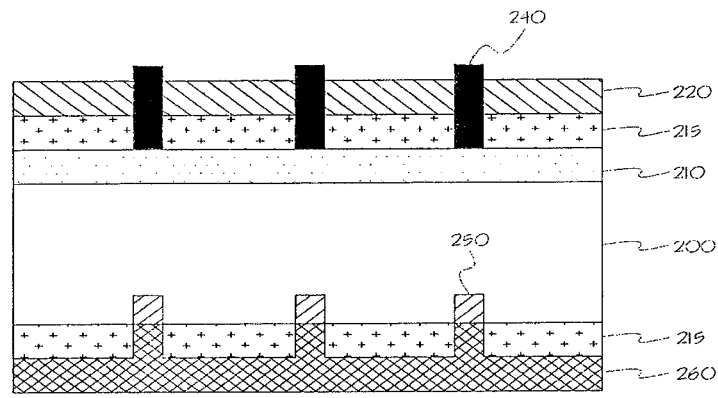
FIG. 10 is a sectional view illustrating a structure of a solar cell in accordance with an embodiment of the present invention.
Figure 11:
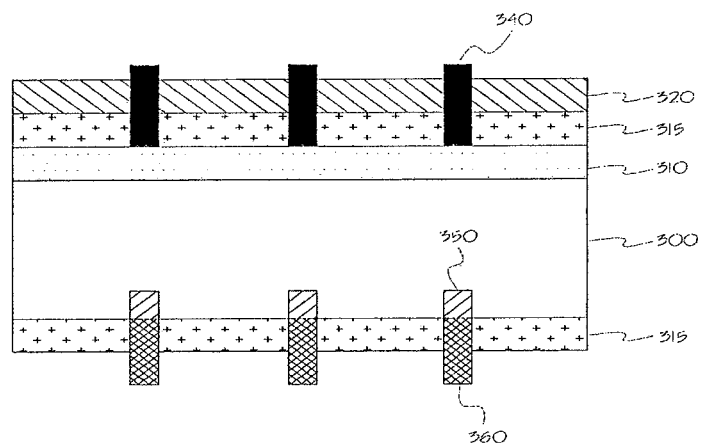
FIG. 11 is a sectional view illustrating a structure of a solar cell in accordance with another embodiment of the present invention.

FIGS. 10 and 11 are sectional views illustrating structures of solar cells in accordance with other embodiments of the present invention, respectively.

In both structures of FIGS. 10 and 11, dielectric layers are additionally formed on the front and rear surfaces of the solar cells.

As shown in FIGS. 10 and 11, in accordance with these embodiments of the present invention, dielectric layers 215 and 315 are additionally formed between n-type emitter layers 210 and 310 formed on the front surfaces of p-type semiconductor substrates 200 and 300 of the solar cells.

The dielectric layers 215 and 315 may be formed by known methods, such as atmospheric pressure chemical vapor deposition (APCVD), low pressure chemical vapor deposition (LPCVD), plasma enhanced chemical vapor deposition (PECVD), sputter deposition, electron beam vapor deposition, and a spin-on process, but the formation of the dielectric layers 215 and 315 is not limited to a specific method. The dielectric layers 215 and 315 are made of a dielectric material, such as a silicon oxide film or a silicon nitride film.

The n-type emitter layers 210 and 310 are formed on the p-type semiconductor substrates 200 and 300, and then the dielectric layers 215 and 315 and the anti-reflection films 220 and 320 are sequentially formed. Thereafter, at least one opening, in which each of front electrodes 240 and 340 will be formed, is formed in a pattern by etching the dielectric layers 215 and 315 and the anti-reflection films 220 and 320, for example, simultaneously or sequentially.

The formation of the openings was already described with reference to FIGS. 1 to 9, and thus a separate description thereof will be omitted. Application of the etching paste through the screen printing method and heat treatment of the etching paste to etch the dielectric layers and the anti-reflection films of FIGS. 10 and 11 may be performed under different conditions than those of FIGS. 1 to 9. The openings are formed through this process, the upper surfaces of the n-type emitter layers 210 and 310 are exposed through the openings, and then the front electrodes 240 and 340 are formed on the exposed upper surfaces of the n-type emitter layers 210 and 310.

Also, in processes of fabricating solar cells, as shown in FIGS. 10 and 11, the screen printing method is performed twice using the etching paste and the front electrode paste, and a temperature of heat treatment to sinter the front electrodes is the same as the above-described temperature.

The solar cells of FIGS. 10 and 11 respectively have rear electrodes of different shapes. In case of the solar cell of FIG. 10, a rear electrode 260 is formed on the overall rear surface of the p-type semiconductor substrate 200, and a dielectric layer 215 is additionally provided between the p-type semiconductor substrate 200 and the rear electrode 260.

With reference to FIG. 10, the dielectric layer 215 formed on the rear surface of the p-type semiconductor substrate 200 has at least one opening, and the rear electrode 260 is in contact with the rear surface of the p-type semiconductor substrate 200 through the at least one opening. A back surface field layer 250 doped with a high concentration of the p-type impurity is formed in regions in which the rear electrode 260 is in contact with the rear surface of the p-type semiconductor substrate 200.

The rear surface structure, as shown in FIG. 10, is fabricated by forming the dielectric layer 215 on the rear surface of the p-type semiconductor substrate 200, etching at least one opening on the dielectric layer 215, applying the rear electrode paste to the overall surface of the dielectric layer 215, and causing the rear electrode paste to be in contact with the rear surface of the p-type semiconductor substrate 200 through the at least one opening by heat treatment and diffusing the p-type impurity, such as aluminum, onto the rear surface of the p-type semiconductor substrate 200.

The formation of the at least one opening on the dielectric layer 215 may be achieved by a method using a laser, or be achieved by the same method as the formation of the front openings.

In the rear surface structure of the solar cell of FIG. 11, differing from the rear surface of the solar cell of FIG. 10, a rear electrode is not formed on the overall rear surface of the p-type semiconductor substrate 300, but rear electrodes 360 are formed in openings of the dielectric layer 315 formed on the rear surface of the p-type semiconductor substrate 300.

That is, the rear electrodes 360 separated from each other on the rear surface of the p-type semiconductor substrate 300 are formed in the openings formed through the dielectric layer 315. In the same manner as FIG. 10, a back surface field layer 350 doped with a high concentration of the p-type impurity is formed on interfaces between the rear electrodes 360 and the rear surface of the p-type semiconductor substrate 300.

The structure of FIG. 11, in which the respective rear electrodes 360 are not electrically connected to each other due to the dielectric layer 315 formed on the rear surface of the substrate 300, reduces the manufacturing cost of the solar cell, compared with the structure of FIG. 10.

In other embodiments of the invention, the substrate 100 may be an n-type and the emitter layer 110 may be a p-type in a solar cell, which is different from the embodiments discussed above. Since the above discussions apply to such a solar cell except for the different type doping of the substrate 100 and the emitter layer 110, a detailed description will be omitted.

It will be understood by those skilled in the art that example embodiments can be implemented in other specific forms without changing the technical spirit or essential features of the present invention. Therefore, it should be noted that the forgoing embodiments are merely illustrative in all aspects and are not to be construed as limiting the invention. Those skilled in the art will appreciate that various modifications, additions, and substitutions to the specific elements are possible, without departing from the scope and spirit of the invention as disclosed in the accompanying claims. Further, those skilled in the art will appreciate that materials of the above-described components may be selected from various known materials.

Further, those skilled in the art will appreciate that some of the above-described components may be omitted without performance deterioration or any component may be added to improve performance. Moreover, those skilled in the art will appreciate that the order of the processes of the above-described method may be changed according to process environment or equipment. Therefore, the scope of the present invention is determined by the claims and their equivalents other than the above-described embodiments.

The effects of the present invention are not limited to the above-mentioned effects, and other effects not mentioned above can be clearly understood from the definitions in the claims by one skilled in the art.

What is claimed is:

1. A fabricating method of a solar cell, the method comprising:
    forming a second conductive-type semiconductor layer by doping a front surface of a first conductivity-type semiconductor substrate with a second conductivity-type impurity having a conductivity opposite to that of the first conductivity-type semiconductor substrate;
    forming an anti-reflection film on a front surface of the second conductive-type semiconductor layer formed on the front surface of the first conductive-type semiconductor layer;
    forming at least one opening exposing a part of the front surface of the second conductive-type semiconductor layer by etching the anti-reflection film;
    forming at least one front electrode contacting the part of the front surface of the second conductivity-type semiconductor layer exposed through the at least one opening formed at the anti-reflection film on the front surface of the second conductive-type semiconductor layer; and forming at least one rear electrode formed on a rear surface of the first conductivity-type semiconductor substrate, wherein the forming of the at least one front electrode is achieved by applying an electrode paste in the at least one opening using a screen printing method or a direct printing method and performing heat treatment, and the electrode paste includes a metal containing silver (Ag) or a metal alloy containing silver (Ag), lead-free glass frit, and a resin binding agent dispersed in an organic medium.

2. The fabricating method according to claim 1, wherein the at least one opening is formed by patterning an etching paste on the anti-reflection film using the screen printing method or the direct printing method and then etching the anti-reflection film using the etching paste.

3. The fabricating method according to claim 1, wherein the at least one opening is formed by patterning a mask layer on the anti-reflection film, etching the anti- reflection film in regions of which the mask layer is not formed, and then removing the mask layer.

4. The fabricating method according to claim 3, wherein the mask layer is formed by patterning an etching prevention paste on the anti-reflection film using the screen printing method or the direct printing method.

5. The fabricating method according to claim 1, wherein a temperature for performing the heat treatment is about 500~850° C.

6. The fabricating method according to claim 1, further comprising forming prominences and depressions on the front surface or the front and rear surfaces of the first conductivity-type semiconductor substrate by texturing the first conductivity-type semiconductor substrate.

7. The fabricating method according to claim 1, wherein the formation of the at least one rear electrode includes forming a back surface field layer on the rear surface of the first conductivity-type semiconductor substrate by applying a rear electrode paste to the rear surface of the first conductivity-type semiconductor substrate and performing heat treatment.

8. The fabricating method according to claim 1, wherein, prior to the forming of the at least one rear electrode, the method further comprises:

forming a dielectric layer on the rear surface of the first conductivity-type semiconductor substrate; and forming at least one opening, through which the at least one rear electrode contacts the rear surface of the first conductivity-type semiconductor substrate, through the dielectric layer.

* * * * *